US005552721A

United States Patent [19]
Gould

[11] Patent Number: 5,552,721
[45] Date of Patent: Sep. 3, 1996

[54] METHOD AND SYSTEM FOR ENHANCED DRIVE IN PROGRAMMMABLE GATE ARRAYS

[75] Inventor: Scott W. Gould, So. Burlington, Vt.

[73] Assignee: International Business Machines Corporation, Armonk, N.Y.

[21] Appl. No.: 463,108

[22] Filed: Jun. 5, 1995

[51] Int. Cl.$^6$ .............................................. H03K 19/0175
[52] U.S. Cl. ..................................................... 326/39; 326/82
[58] Field of Search ........................................... 326/39, 82

[56] References Cited

U.S. PATENT DOCUMENTS

| | | | |
|---|---|---|---|
| 4,506,341 | 3/1985 | Kalter et al. | 326/39 |
| 4,724,531 | 2/1988 | Angleton et al. | 365/189 |
| 4,904,886 | 2/1990 | Tanahashi | 326/82 |
| 5,187,393 | 2/1993 | El Gamal et al. | 307/465.1 |
| 5,220,213 | 6/1993 | Chan et al. | 307/465 |
| 5,313,119 | 5/1994 | Cooke et al. | 307/465.1 |
| 5,329,180 | 7/1994 | Popli et al. | 307/465 |
| 5,331,226 | 7/1994 | Goetting | 307/465 |
| 5,332,929 | 7/1994 | Chiang | 307/296.3 |
| 5,339,262 | 8/1994 | Rostoker et al. | 364/578 |
| 5,365,125 | 11/1994 | Goetting et al. | 326/39 |
| 5,394,034 | 2/1995 | Becker et al. | 326/39 |

Primary Examiner—Edward P. Westin
Assistant Examiner—Richard Roseen
Attorney, Agent, or Firm—Heslin & Rothenberg, P.C.

[57] ABSTRACT

In a programmable gate array ("PGA"), logic cells therein are programmed to create a combined output with enhanced current driving ability. Specifically, a first logic cell is programmed to have a first output and a second logic cell is programmed to have a second output. The first and second outputs are connected within the PGA forming a combined output having enhanced current driving ability by the first logic cell and the second logic cell. The first and second logic cells are programmed with identical logic functions such that they operate in parallel.

15 Claims, 5 Drawing Sheets

METHOD AND SYSTEM FOR ENHANCED DRIVE IN PROGRAMMMABLE GATE ARRAYS

RELATED APPLICATION INFORMATION

This application relates to commonly owned concurrently or previously filed U.S. Patent Applications:

1. Ser. No. 08/459,579, entitled "PROGRAMMABLE ARRAY INTERCONNECT NETWORK," docket number BU9-95-025;

2. Ser. No. 08/460,420, entitled "PROGRAMMABLE ARRAY I/O—ROUTING RESOURCE," docket number BU9-95-023;

3. Ser. No. 08/460,481, entitled "PROGRAMMABLE LOGIC CELL," docket number BU9-95-019.

The section entitled "Description of the Preferred Embodiment(s)," and the drawings, from each of the above-referenced related U.S. Patent applications are hereby expressly incorporated herein by reference.

TECHNICAL FIELD

The present invention relates in general to programmable integrated circuit devices having a plurality of programmable logic cells and a programmable interconnection network. More specifically, the present invention relates to a method and system for enhanced drive capability in programmable arrays.

BACKGROUND OF THE INVENTION

Programmable integrated circuits are known in the art and include programmable logic devices ("PLDs"), Programmable Array Logic ("PALs"), and Programmable Logic Arrays ("PLAs"). Each of these programmable circuits provides an input AND logic plane followed by an OR logic plane. An output function which is the sum of the products of the input terms can thus be calculated. The logic planes are usually programmable such that the initial general layout of the planes may be customized for a particular application.

A more general approach to programmable circuits involves providing an array of distinct, uncommitted logic cells in a Programmable Gate Array ("PGA"). A programmable interconnect network is usually provided to interconnect the cells, and to provide data input to, and output from, the array. Customization or programming of the otherwise generally-designed logic cells and interconnect network is performed for a particular application. One such array is a Mask Programmable Gate Array ("MPGA"), wherein the configuration of the cells and the wiring network occurs when adding the final layers of metallization to an integrated circuit. A modified approach involves the use of laser-directed energy to customize the metallization pattern. Another such array is a Field Programmable Gate Array ("FPGA") in which the configuration can be performed by a user, in the "field." Such configuration may be effected by using electrically programmable fusible links, antifuses, memory-controlled transistors, or floating-gate transistors. All of the above-discussed types of programmable logic integrated circuits are referred to herein as "programmable arrays."

In any of the above-described programmable arrays, various loading conditions may exist on the output of the various logic cells therein. This is due to the wide variety of configurations that are possible. For example, outputs of logic cells may be directed to inputs of multiple other logic cells within the programmable array. Based thereon, problems may arise concerning drive capability and resulting signal skew and latency. Of course, to reduce these problems, individual devices within the programmable array could be sized larger, but this decreases overall IC density. The present invention is directed toward providing solutions for the above discussed problems.

SUMMARY OF THE INVENTION

In a first aspect, the present invention comprises, a programmable array ("PA") having a first logic cell and a second logic cell. The first logic cell has a first output, and the second logic cell has a second output. The first output and the second output are connected within the PA forming a combined output to facilitate enhanced current driving capability on the combined output by the first logic cell and the second logic cell.

As an enhancement, the first logic cell may include a first output multiplexer having an output comprising the first output of the first logic cell. The second logic cell may include a second output multiplexer having an output comprising the second output of the second logic Cell. Further, each of the output multiplexers may comprise programmable output multiplexers.

In another aspect, the present invention includes a method for configuring a PA having a first logic cell and a second logic cell. The method comprises configuring the first logic cell to have a first output and configuring the second logic cell to have a second output. The first output and the second output are electrically connected within the PA forming a combined output that facilitates enhanced current drive thereon by the first logic cell and the second logic cell.

As an enhancement, the first output multiplexer may comprise a first programmable output multiplexer and the second output multiplexer may comprise a second programmable output multiplexer. The method may then include programming the first programmable output multiplexer and programming the second programmable output multiplexer. Further, the method may include programming the first logic cell and the second logic cell to perform a same logic function.

The present invention has numerous advantages and features associated with it. An output signal with increased drive capability is facilitated within a PA using programming techniques. Thus, the need for, for example, internal buffers, or a redesigned PA with larger sized transistors, is obviated. Furthermore, the programmable nature of PAs facilitates the production of a device with different increased drive capabilities by programming (or reprogramming), rather than by specialized hardware design changes. Such increase drive decreases signal latency, reduces signal skew and generally improves signal quality. The techniques of the present invention can be applied to any type of programmable array. An improvement in overall versatility and utility of PAs is therefore provided.

BRIEF DESCRIPTION OF THE DRAWINGS

The subject matter regarded as the present invention is particularly pointed out and distinctly claimed in the concluding portion of the specification. The invention, however, both as to organization and method of practice, together with further objects and advantages thereof, may best be understood by reference to the following detailed description of a preferred embodiment and the accompanying drawings in which:

DESCRIPTION OF THE PREFERRED EMBODIMENT(S)

Figure 1:
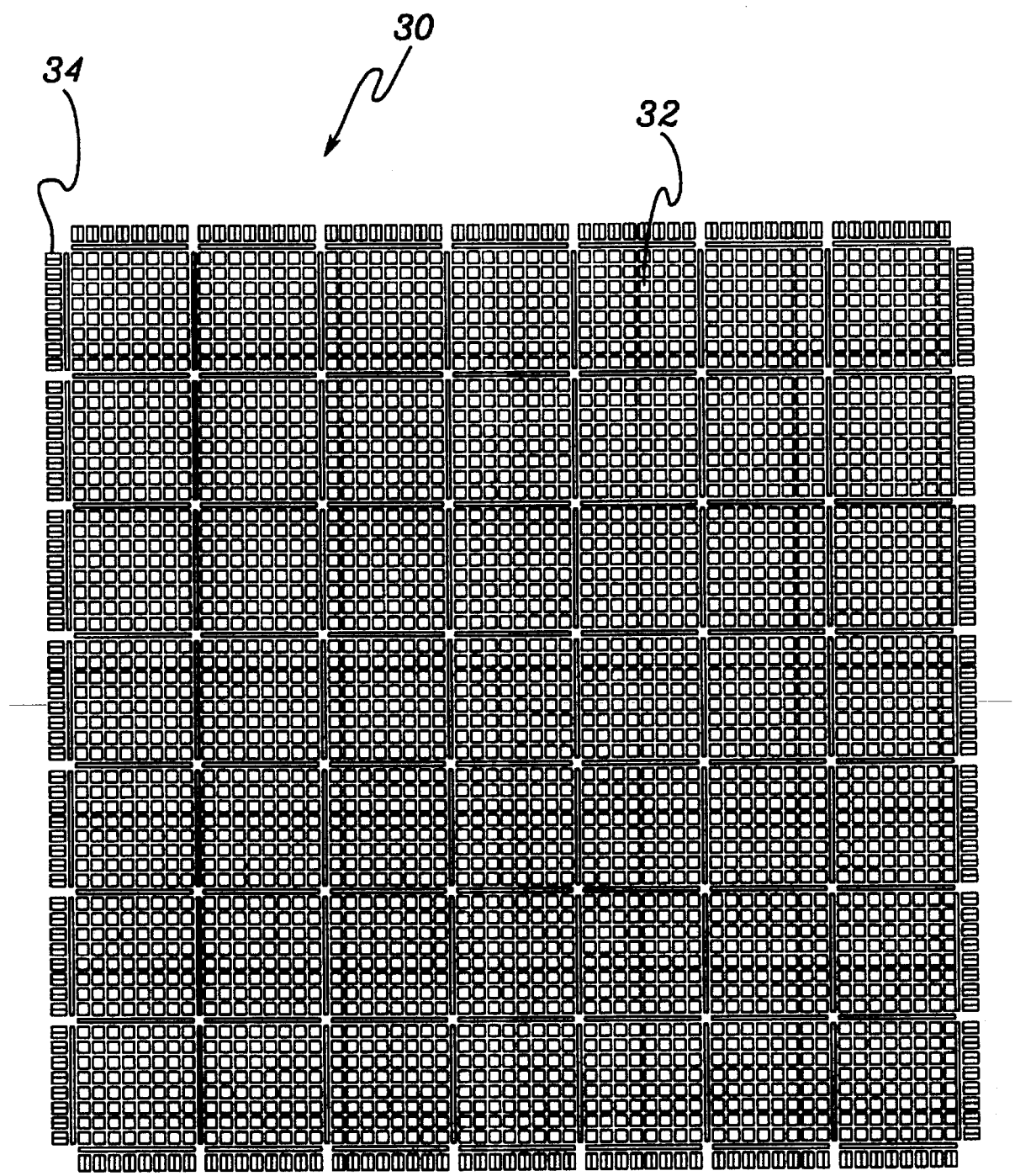
FIG. 1 illustrates a programmable gate array ("PGA") having a plurality of programmable logic cells arranged therein pursuant to the principles of the present invention.

With reference to FIG. 1, there is shown a layout of a programmable gate array 30 comprising a plurality of logic cells 32. In this particular embodiment, the plurality of programmable logic cells comprises a 56×56 array of cells divided into sectors of cells, wherein each sector is defined by an 8×8 group of cells. Also depicted are input/output pins 34 along the perimeter of the array which may be used for data input and output. In addition, certain pins may be dedicated for use as clock pins, reset pins, or for configuration pins for programming the programmable resources of the array 30. The input/output portion of the array can be implemented according to the above-incorporated portions of the U.S. Patent application entitled "PROGRAMMABLE ARRAY I/O—ROUTING RESOURCE."

Figure 2:
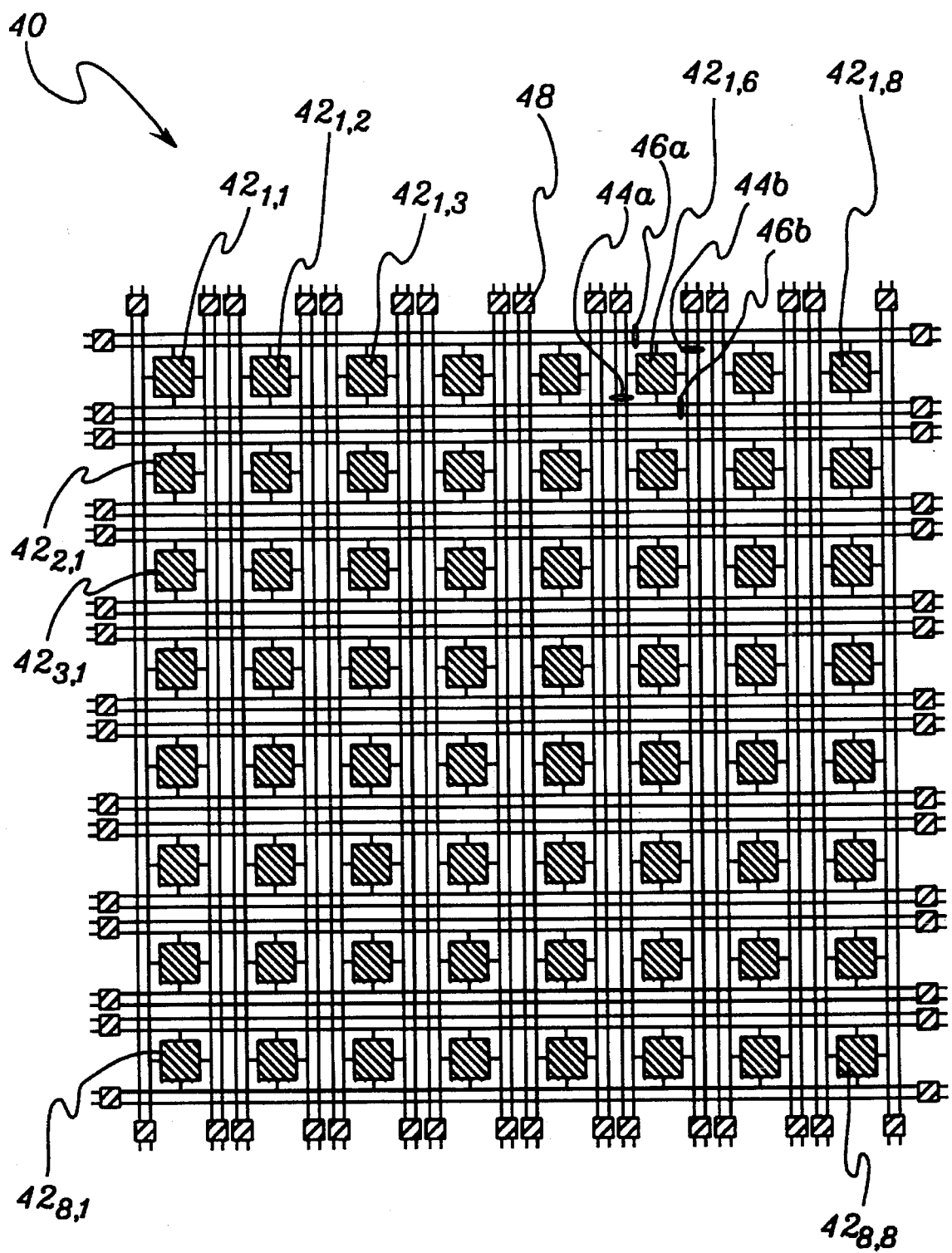
FIG. 2 depicts a portion of a PGA having a plurality of programmable logic cells and an interconnect network connecting them in conformance with one embodiment of the present invention.

With reference to FIG. 2, there is shown a single sector 40 of programmable logic cells of the array of FIG. 1. A single sector comprises logic cells $42_{1,1}$ to $42_{8,8}$. Regarding logic cell $42_{1,6}$, the cell is shown generally surrounded by vertical interconnect conductors 44a and 44b, and horizontal interconnect conductors 46a and 46b. These horizontal and vertical interconnect conductors are positioned between each row and column of the array and provide connections between any two logic cells therein, or between any logic cell in the array and the input/output pins. The interconnect conductors together form the overall interconnect network of the programmable array. Programmable resources within the interconnect network may be provided in addition to those in programmable logic cells. The programmable resources in the interconnect network may include, for example, switching elements 48 that allow signals to be transmitted between two vertical conductors. In addition, bus turns (not shown) may be employed to provide programmable interconnections between a specified vertical and a specified horizontal interconnect conductor. The interconnect network can be implemented according to the above-incorporated portions of the U.S. Patent application entitled "PROGRAMMABLE ARRAY INTERCONNECT NETWORK."

Pursuant to techniques of the present invention, multiple logic cells are connected in parallel to increase current drive on a particular interconnect conductor within the PGA. That is, multiple logic cells are programmed with the same logic function and are connected to the same input and to the same output interconnect conductor(s) within the PGA. As the multiple logic cells operate in parallel, they each drive the same output line, thus increasing the current drive thereon. Advantageously, such increased current drive is achieved by a particular programming of the PGA and does not require specially (i.e., large) sized transistors within the PGA IC chip.

Figure 3:
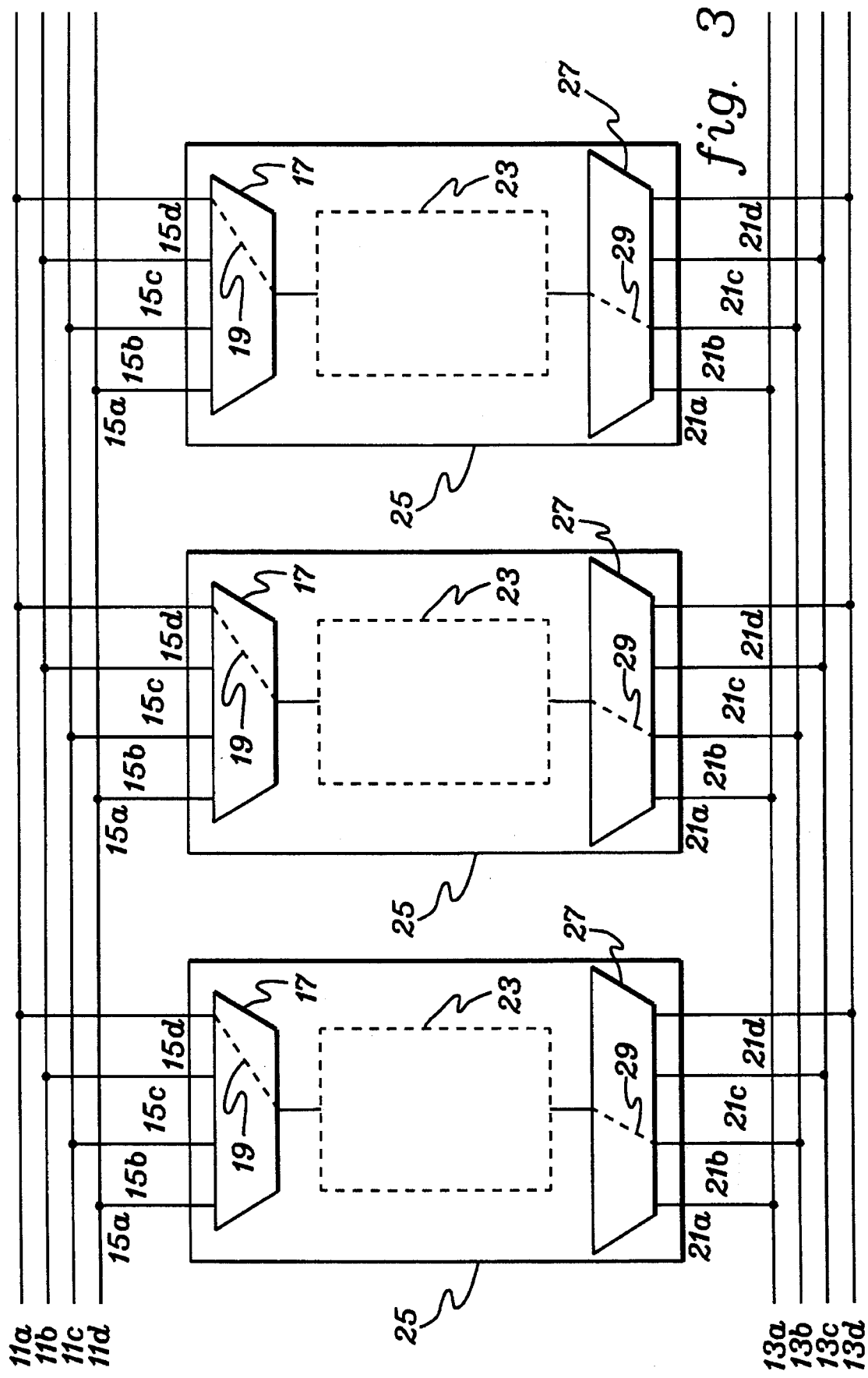
FIG. 3 depicts three logic cells of the PGA of FIG. 2, each driving the same output line in parallel according to an embodiment of the present invention.

Shown in FIG. 3 are three logic cells 25 that each contain input multiplexer ("mux") 17, logic 23 and output mux 27. For each of the logic cells 25, the input mux is connected to horizontal interconnect conductors 11a–d by individual connections 15a–d, while the output mux 27 is connected to horizontal interconnect conductors 13a–d by individual connections 21a–d. Although not shown for purposes of clarity, the logic cells 25 may each be connected to vertical interconnect conductors and may each include additional inputs and outputs as will be apparent to one of ordinary skill in the art.

Each of the three logic cells 25 is programmed with an identical logic function and is connected to the same horizontal interconnect conductor 11a for input and the same horizontal interconnect conductor 13b for output. This facilitates parallel operation responsive to the same input, processed by the same logic function and driving the same output line/interconnect conductor (herein referred to as a "combined output line"). Of course, the number of logic cells 25 operating in parallel may be varied depending on the drive capability needed. As few as two cells or as many cells as permitted by the PGA configuration may be used.

The input muxs 17 and output muxs 27 of each logic cell 25 of the three logic cells of Pig. 3 are programmable. Specifically, each input mux 17 is programmed with connection 19 that establishes horizontal interconnect conductor 11a as an input of the PGA, while each of the output muxs 27 is programmed with connection 29 that establishes horizontal interconnect conductor 13b as the combined output. It will be evident to one of ordinary skill in the art that there are many ways of implementing the programmed connections 19 and 29. As examples, the multiplexers (17 and 27) may comprise pass transistors, fusible links or antifuses which effect the desired isolation or connection between the horizontal (or vertical) interconnections and the inputs and outputs of the logic cell. A user, upon requiring a specified connection, would perform the proper programming to effect the connection. The individual programming steps required for such connections will be apparent to one of ordinary skill in the art.

Specifically, a laser-programmed device could employ optional welds to provide the connections. The required connections are provided by either including or excluding the welds. A mask-programmed device would simply include or omit the relevant connections. Any structure for signal selection in which before programming, a plurality of signals are available for selection, and after programming, one of the signals is selected, is referred to herein as a "multiplexer." A "connection," as used herein, and unless otherwise expressly indicated, broadly denotes either a direct, conductive connection between conductors, or an indirect (e.g., buffered/inverted) interface in which the information from one conductor is nevertheless supplied to the other conductor. Similarly, an "input" or an "output" denotes either a direct or indirect (e.g., buffered/inverted) interface, unless otherwise expressly indicated.

In the preferred embodiment, pass gate multiplexers ("muxs") are employed as the input 17 and output 27 muxs of the logic cells. These pass gates muxs are controlled by static random access memory ("SRAM") cells. The SRAM cells are directly or indirectly (through decoders) tied to the gates of the pass gates within a pass gate multiplexer thus controlling the state of the pass gates. In, for example, the input muxs 17 or output muxs 27, four such pass gates form 4:1 (or 1:4) pass gate multiplexers. Software and decoding logic of the programming system ensure that only one particular pass gate is connected to any single input/output node at any given time.

Figure 4:
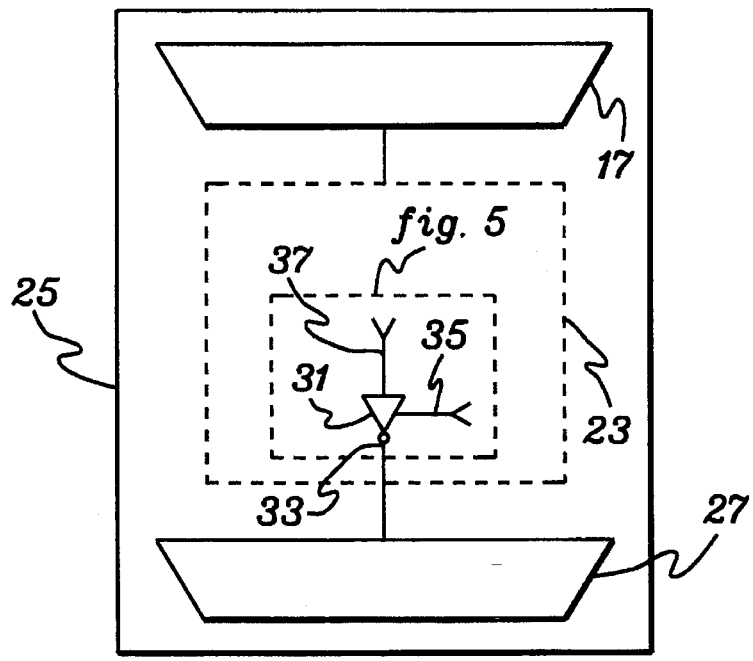
FIG. 4 depicts one of the logic cells of FIG. 3, with further internal detail, pursuant to one embodiment of the present invention.

In one embodiment, a tri-state invertor/buffer 31 drives the output mux 27 of each of the logic cells 25 (FIG. 4). The invertor 31 accepts an input 37 from circuitry 23 of the logic cell and provides an output 33 to output mux 27. A tri-state enable input 35 controls the output of the invertor 31 as either floating or asserting a signal on output line 33. During operation, the output 33 of the invertor is routed by output mux 27 to the appropriate (e.g., horizontal or vertical) interconnect conductor within the PGA.

Figure 5:
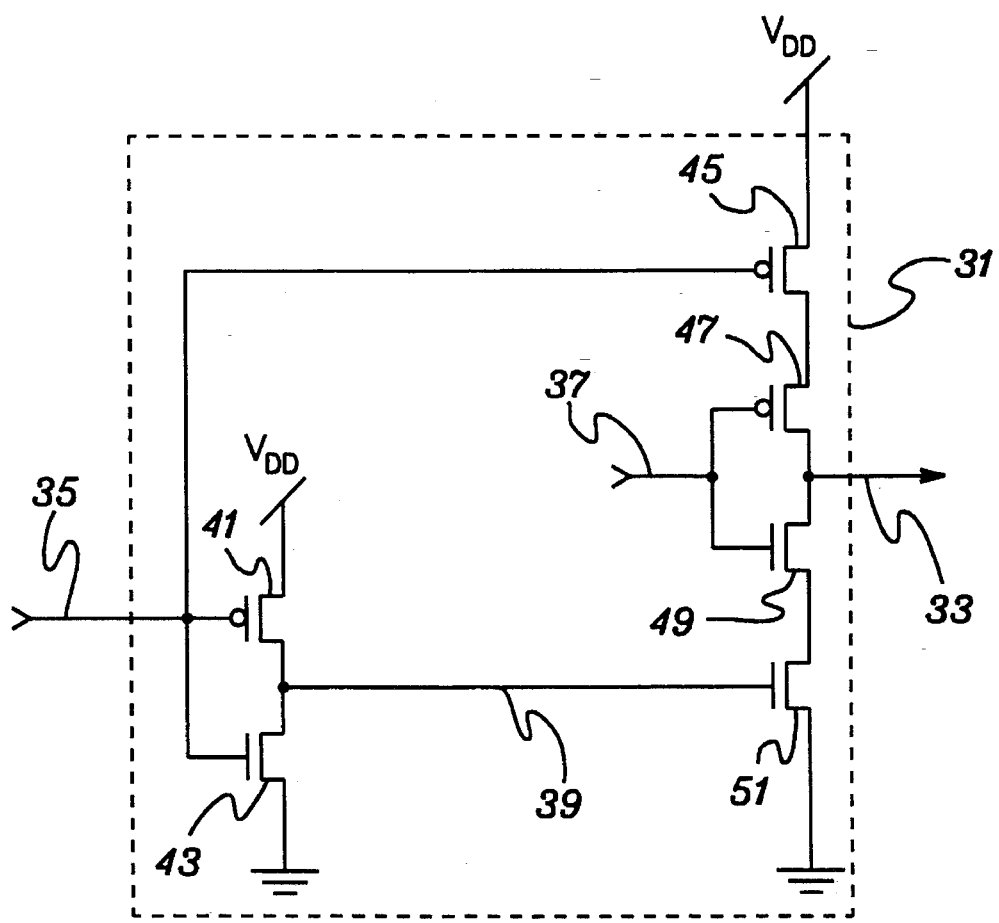
FIG. 5 is a circuit diagram of the tri-state invertor of the logic cell of FIG. 4 according to an embodiment of the present invention.

The circuitry of the tri-state invertor/buffer 31 is shown in detail in the circuit diagram of FIG. 5. A two-transistor invertor comprising transistors 47 and 49 provides the inversion of the logic state of input 37 on output line 33 (when output is asserted, i.e., not floated). The tri-state capabilities of the two-transistor invertor are provided by biasing transistors 45 and 51. These transistors 45 and 51 can "disconnect" power from invertor transistors 47 and 49 such that output 33 floats. Control of biasing transistors 45 and 51 is provided by tri-state enable control 35 and inverted tri-state enable control signal 39. Inverted tri-state enable control signal 39 is provided by a two-transistor invertor comprising transistors 41 and 43.

In an another embodiment of the present invention, tri-state invertor/buffer 31 may be replaced with an invertor. The tri-state functionality is moved to within the decode logic associated with each pass gate of output mux 27.

As discussed above, various technologies are known to those skilled in the art to provide array programmability. Any of these techniques, or variants thereof, can be used to program the logic cell of the present invention. Mask programming techniques include customizing the deposition of the final layers of metallization of an otherwise generally designed integrated circuit (see, for example, U.S. Pat. No. 3,993,919 to Cox et al. entitled "PROGRAMMABLE LATCH AND OTHER CIRCUITS FOR LOGIC ARRAYS," Nov. 23, 1976; and U.S. Pat. No. 4,742,383 to Fitzgerald entitled "MULTI-FUNCTION FET MASTER-SLICE CELL," May 3, 1988; both patents assigned to the same assignee as the present application). Laser programming techniques involve customizing the metallization layers following their deposition (see, for example, Raffel et al., "A WAFER-SCALE DIGITAL INTEGRATOR USING RESTRUCTURABLE VSLI," IEEE Journal of Solid-State Circuits, Vol. SC-20, No. 1, February 1985, at pg. 399). Fusible links or antifuses can be employed and offer permanent (non-volatile) programming (see, for example, Millman, "MICROELECTRONICS," McGraw-Hill, Inc., 1979, at pg. 196; and U.S. Pat. No. 4,758,745 to Elgamal et al. entitled "USER PROGRAMMABLE INTEGRATED CIRCUIT INTERCONNECT ARCHITECTURE AND TEST METHOD," Jul. 19, 1988). Erasable programmable read only memory ("EPROM") and electrically erasable programmable read only memory ("EEPROM") devices can be used and offer semi-permanent programming. EPROMS and EEPROMS are both electrically programmable and hold their states, even if power is removed. Special erase procedures can be used, however, to reconfigure the devices (see, for example, Wood et al., "AN ELECTRICALLY ALTERABLE PLA FOR FAST TURNAROUND TIME VLSI DEVELOPMENT HARDWARE," IEEE Journal of Solid-State Circuits, Vol. SC-16, No. 5, October 1981, at pg. 570). Finally, volatile random access memory ("RAM") devices are also available which are fully programmable and reprogrammable, but which lose their programmed state if power is removed (see, for example, U.S. Pat. No. 4,177,452 to Balasubramanian et al., Dec. 4, 1979, assigned to the same assignee as the present application). These and other techniques for programming arrays are known to those in the art and are also generally described in the publication entitled "FIELD-PROGRAMMABLE GATE ARRAYS" by S. Brown, R. Francis, J. Rose and Z. Vranesic, Kluwer Academic Publishers, 1992. Each of the above-named sources is hereby incorporated herein by reference in its entirety.

As discussed above, the preferred approach for programming the logic cells of the present invention involves SRAM memory cells, programmed by a user. The array can be configured in accordance with the techniques disclosed in the publication entitled "APPLICATION NOTE AT6000 SERIES CONFIGURATION", May 1993, Revision 1B, Atmel Corporation, which is hereby incorporated by reference herein its entirety.

Figure 6:
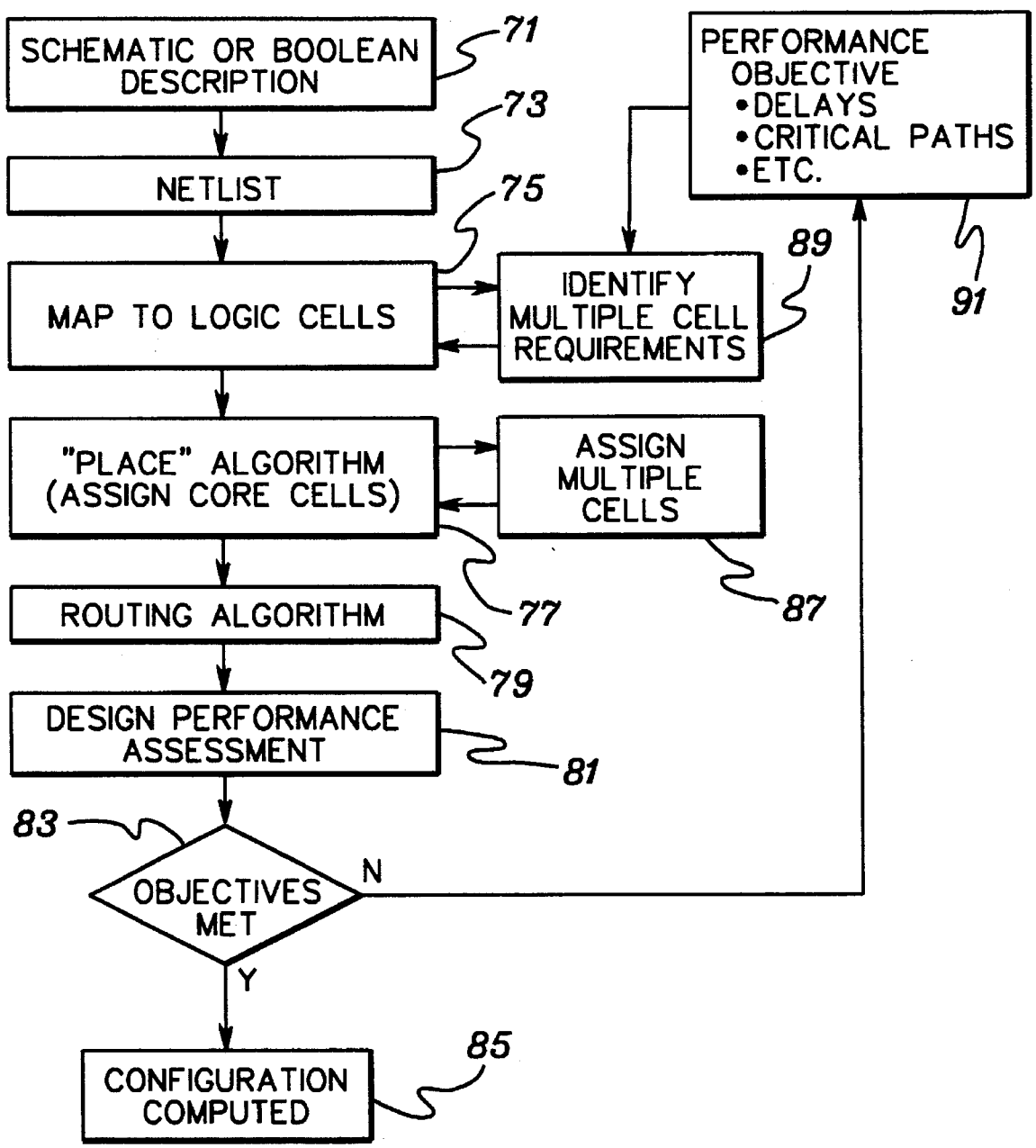
FIG. 6 is a flow diagram of a method for programming a PGA in conformance with one embodiment of the present invention.

A method for programming the PGA of the present invention is shown in the flow diagram of FIG. 6. The method begins with the production of a schematic or boolean description of the needed logic function for the PGA (71). A netlist is then created based upon the schematic or boolean expression (73). Logic cells are then mapped to the netlist to satisfy the desired logic function (75).

According to the techniques of the present invention, the designer inputs performance objectives into the PGA design. These objectives may be, for example, explicitly identified critical paths, or performance (e.g., latency) objectives that correspond to critical paths (91). A number of paralleled multiple logic cells are then automatically determined (89) such that the performance objectives are met. This determination may be made by well known modeling techniques that incorporate data such as the drive capability of each logic cell and the current requirements of the inputs of the logic cells. As one example, in "VLSI Engineering," by Thomas E. Dillinger, 1988, various modelling techniques for calculating the performance of a path based upon the attached logic are discussed. "VLSI Engineering" is hereby incorporated by reference herein in its entirety.

Of course, since the complete PGA design is not yet "routed," parameters such as route lengths within the PGA are not known such that the number of paralleled logic cells required is only an estimate. The multiple (i.e., parallel) cells are then assigned in the PGA (77, 87) requirements, and the actual routing is performed for the PGA (79). Various modeling, assignment and routing techniques are discussed in "Field Programmable Gate Arrays," by Brown et al. incorporated by reference hereinabove.

After the complete PGA has been "routed," it may be modeled to determine if the above described performance objectives have been met (81). Since actual placement and routing within the PGA has been established, a very detailed analysis is possible. If the performance objectives are met (83), the configuration is complete (85). If the performance objectives are not met, then the user may wish to change the objectives (91), or, for example, more paralleled logic cells may be added (89) if available. The process is repeated until the specified performance objectives are satisfied.

During the PGA design stage, paralleled logic cells can be grouped using the macro capabilities of PGA design tools. A macro comprises a group of paralleled logic cells as discussed herein and is assigned its corresponding drive capability and other related parameters. It is also desirable to specify to the PGA design tool that the paralleled logic cells be placed physically next to each other sharing the interconnect line. This avoids any of the paralleled logic cells from being across a repeater or a jumper boundary from each other.

If a less complicated PGA design tool is used, a more manual approach can be taken. The assignment of multiple logic cells (87) would be performed manually by designer intervention after the placing algorithm has run. It is at this stage that the designer will ensure that the paralleled logic cells are physically close together and driving the same bus.

Various uses of the parallel logic cell configurations (e.g., FIG. 3) of the present invention are possible. For example, the combined output may be connected internal to the PGA as an input to logic cell(s) within the PGA. The increased drive capability decreases signal latency and skew, and improves overall signal quality when driving, for example, long routes or multiple loads (i.e., logic cell inputs).

The present invention has numerous advantages and features associated with it. An output signal with increased drive capability is facilitated within a PGA using programming techniques. Thus, the need for, for example, internal buffers, or a redesigned PGA with larger sized transistors, is obviated. Furthermore, the programmable nature of PGAs facilitates the production of a device with different increased drive capabilities by reprogramming, rather than by specialized hardware design changes. Such increase drive decreases signal latency, reduces signal skew and generally improves signal quality. Of course, the techniques of the present invention can be applied to not only PGAs, but any type of programmable array. An improvement in overall versatility and utility of programmable arrays is therefore provided.

While the invention has been described in detail herein in accordance with certain preferred embodiments thereof, many modifications and changes therein may be effected by those skilled in the art. Accordingly, it is intended by the following claims to cover all such modifications and changes as fall within the true spirit and scope of the invention.

What is claimed is:

1. A programmable array comprising:

a first logic cell having a first output; and a second logic cell having a second output, wherein said first output and said second output are connected within said programmable array forming a combined output and carrying a common logic level to facilitate enhanced current driving capability on said combined output by said first logic cell and said second logic cell.

2. The programmable array of claim 1, wherein said first logic cell includes a first output multiplexer having an output comprising said first output of said first logic cell, and wherein said second logic cell includes a second output multiplexer having an output comprising said second output of said second logic cell.

3. The programmable array of claim 2, wherein said first output multiplexer comprises a first programmable output multiplexer programmed to select said first output as output of said first logic cell, and said second output multiplexer comprises a second programmable output multiplexer programmed to select said second output as output of said second logic cell.

4. The programmable array of claim 3, wherein said first output multiplexer has a plurality of outputs including said first output and said second output multiplexer has a plurality of outputs including said second output.

5. The programmable array of claim 1, further comprising a third logic cell having a third output carrying said common logic level and connected to said combined output to facilitate enhanced current driving capability on said combined output by said first logic cell, said second logic cell and said third logic cell.

6. The programmable array of claim 1, wherein said combined output is connected to an input of a selected logic cell within said programmable array.

7. The programmable array of claim 1, wherein said combined output comprises an interconnect conductor in said programmable array.

8. The programmable array of claim 1, wherein said programmable array comprises a field programmable gate array.

9. The programmable array of claim 1, wherein said first logic cell and said second logic cell have a same logic function.

10. A method for configuring a programmable array having a first logic cell and a second logic cell, said method comprising the steps of:

(a) configuring said first logic cell to have a first output; and (b) configuring said second logic cell to have a second output, said first output and said second output being electrically connected within said programmable array forming a combined output and carrying a common logic level to facilitate enhanced current drive on said combined output by said first logic cell and said second logic cell.

11. The method of claim 10, wherein said first output comprises an output of a first output multiplexer, and said second output comprises an output of a second output multiplexer, and wherein said configuring step (a) comprises configuring said first output multiplexer such that said first output comprises output of said first logic cell and said configuring step (b) comprises configuring said second output multiplexer such that said second output comprises output of said second logic cell.

12. The method of claim 11, wherein said first output multiplexer comprises a first programmable output multiplexer and said second output multiplexer comprises a second programmable output multiplexer, and wherein said configuring step (a) comprises programming said first programmable output multiplexer and said configuring step (b) comprises programming said second programmable output multiplexer.

13. The method of claim 10, wherein said method includes programming said first logic cell and said second logic cell to perform a same logic function.

14. The method of claim 10, wherein said method includes configuring said programmable array to couple said combined output to an input of a selected logic cell within said programmable array.

15. The method of claim 10, wherein said programmable array includes a third logic cell and said method further comprises configuring said third logic cell to have a third output carrying said common logic level and connected to said combined output to facilitate enhanced current drive on said combined output by said first logic cell, said second logic cell and said third logic cell.

* * * * *